United States Patent
Mellor et al.

(10) Patent No.: US 8,131,242 B2
(45) Date of Patent: Mar. 6, 2012

(54) SYSTEM AND METHOD FOR IMPLEMENTING A SWAP FUNCTION FOR AN IQ GENERATOR

(75) Inventors: Derek Mellor, Santa Cruz, CA (US); Bernard J. Griffiths, Ben Lomond, CA (US); Frank E. Hayden, Aptos, CA (US)

(73) Assignees: Sony Corporation, Tokyo (JP); Sony Electronics Inc., Park Ridge, NJ (US)

( * ) Notice: Subject to any disclaimer, the term of this patent is extended or adjusted under 35 U.S.C. 154(b) by 1038 days.

(21) Appl. No.: 12/072,772

(22) Filed: Feb. 28, 2008

(65) Prior Publication Data

US 2009/0009226 A1    Jan. 8, 2009

Related U.S. Application Data

(60) Provisional application No. 60/958,224, filed on Jul. 2, 2007.

(51) Int. Cl.
*H04B 1/06* (2006.01)
*H04B 7/00* (2006.01)

(52) U.S. Cl. ........ 455/258; 455/256; 455/265; 455/318; 375/328; 375/330; 375/339; 331/108 B; 327/166; 327/176; 327/295

(58) Field of Classification Search .......... 455/313–333, 455/255–268; 327/165, 166, 171–184, 208–213, 327/291–299; 331/135–137, 108 B; 375/306, 375/307, 308, 326–333, 339
See application file for complete search history.

(56) References Cited

U.S. PATENT DOCUMENTS

| | | | |
|---|---|---|---|
| 4,975,931 A * | 12/1990 | Cosand | 377/52 |
| 5,454,007 A * | 9/1995 | Dutta | 375/322 |
| 5,506,874 A * | 4/1996 | Izzard et al. | 375/340 |
| 6,253,066 B1 * | 6/2001 | Wilhite et al. | 455/108 |
| 6,943,605 B2 * | 9/2005 | Thadikaran et al. | 327/218 |
| 7,379,723 B2 * | 5/2008 | Rafi | 455/216 |
| 7,492,852 B1 * | 2/2009 | Liu | 377/48 |
| 7,773,712 B2 * | 8/2010 | Ikeda | 375/371 |
| 7,863,953 B2 * | 1/2011 | Li | 327/156 |
| 2001/0031028 A1 * | 10/2001 | Vaucher | 375/355 |
| 2004/0036541 A1 * | 2/2004 | Fang et al. | 331/74 |
| 2007/0121762 A1 * | 5/2007 | Mizukami | 375/329 |
| 2007/0147571 A1 * | 6/2007 | Yu et al. | 377/47 |
| 2007/0241796 A1 * | 10/2007 | Sie | 327/115 |
| 2008/0238624 A1 * | 10/2008 | Safarian et al. | 340/10.1 |
| 2009/0045861 A1 * | 2/2009 | Hayden et al. | 327/238 |

* cited by examiner

*Primary Examiner* — Edward Urban
*Assistant Examiner* — Rui Hu
(74) *Attorney, Agent, or Firm* — Gregory J. Koerner; Redwood Patent Law

(57) ABSTRACT

A system and method for implementing an IQ generator includes a master latch that generates an I signal in response to a clock input signal, and a slave latch that generates a Q signal in response to an inverted clock input signal. A master selector is configured to provide a communication path from the master latch to the slave latch, and a slave selector is configured to provide a feedback path from the slave latch to the master latch. The foregoing I and Q signals are output directly from the respective master and slave latches without any intervening electronic circuitry.

20 Claims, 13 Drawing Sheets

SYSTEM AND METHOD FOR IMPLEMENTING A SWAP FUNCTION FOR AN IQ GENERATOR

CROSS-REFERENCE TO RELATED APPLICATION

This Application claims priority in U.S. Provisional Patent Application No. 60/958,224 entitled "Divide By 2 Generator With Self Retimed IQ Swap Function," that was filed on Jul. 2, 2007. The foregoing related Application is commonly owned, and is hereby incorporated by reference.

BACKGROUND SECTION

1. Field of the Invention

This invention relates generally to techniques for transferring electronic information, and relates more particularly to a system and method for implementing a swap function for an IQ generator.

2. Description of the Background Art

Implementing effective methods for transferring electronic information is a significant consideration for designers and manufacturers of contemporary electronic systems. However, effectively implementing data, transfer systems may create substantial challenges for system designers. For example, enhanced demands for increased system functionality and performance may require more system processing power and require additional hardware resources. An increase in processing or hardware requirements may also result in a corresponding detrimental economic impact due to increased production costs and operational inefficiencies.

Furthermore, enhanced system capability to perform various advanced transfer operations may provide additional benefits to a system user, but may also place increased demands on the control and management of various system components. For example, an enhanced electronic system that wirelessly transfers digital image data may benefit from an effective implementation because of the large amount and complexity of the digital data involved.

Due to growing demands on system resources and substantially increasing data magnitudes, it is apparent that developing new techniques for implementing and utilizing data transfer systems is a matter of concern for related electronic technologies. Therefore, for all the foregoing reasons, developing effective systems for transferring electronic information remains a significant consideration for designers, manufacturers, and users of contemporary electronic systems.

SUMMARY

In accordance with the present invention, a system and method are disclosed for implementing a swap function for an IQ generator. In accordance with one embodiment, the IQ generator comprises a master latch that generates an I signal in response to a clock input signal, and a slave latch that generates a Q signal in response to an inverted clock input signal. A master selector is configured to provide a communication path from the master latch to the slave latch, and a slave selector is configured to provide a feedback path from the slave latch to the master latch.

In one embodiment, the master latch receives the clock input signal at a master clock input, and the slave latch receives the inverted clock input signal at a slave clock input. A master output of the master latch is directly output as the I signal, and the master output is also provided to a first master selector input of the master selector. An inverted master output of the master latch is provided to a second master selector input of the master selector, and a master latch output is provided to a slave data input of the slave latch. A slave output of the slave latch is directly output as the Q signal, and the slave output is also provided to a first slave selector input of the slave selector. An inverted slave output of the slave latch is provided to a second slave selector input of the slave selector, and a slave latch output is provided via a feedback loop to a master data input of the master latch.

In one embodiment, the master selector receives a swap signal at a master selector swap input, and the slave selector receives an inverted swap signal at a slave selector swap input. The master and slave selectors function as multiplexers to generate corresponding selector outputs that are selected from either a first selector input or a second selector input depending upon whether the swap signal is activated or deactivated. However, since the swap signal is inverted for the slave selector, the slave selector selects the opposite (inverted) selector input with respect to the master selector.

When the swap signal is disabled, the I signal leads the Q signal by ninety degrees. The master output is provided to the slave data input, and the inverted slave output is looped back to the master data input. Conversely, when the swap signal is enabled, the I signal lags the Q signal by ninety degrees. The inverted master output is provided to the slave data input, and the slave output is looped back to the master data input. The master selector is therefore inserted in a communication path between the master latch and the slave latch, and the slave selector is inserted in a feedback loop between the slave latch and the master latch.

In addition, the master latch provides the I signal directly to an external mixer device without the master selector or any other circuitry intervening. Similarly, the slave latch provides the Q signal directly to the external mixer without the slave selector or any other circuitry intervening. For at least the foregoing reasons, the present invention therefore provides an improved system and method for implementing a swap function for an IQ generator.

DETAILED DESCRIPTION

The present invention relates to an improvement in data transmission systems. The following description is presented to enable one of ordinary skill in the art to make and use the invention, and is provided in the context of a patent application and its requirements. Various modifications to the disclosed embodiments will be readily apparent to those skilled in the art, and the generic principles herein may be applied to other embodiments. Thus, the present invention is not intended to be limited to the embodiments shown, but is to be accorded the widest scope consistent with the principles and features described herein.

The present invention is described herein as a system and method for implementing an IQ generator comprising a master latch that generates an I signal in response to a clock input signal, and a slave latch that generates a Q signal in response to an inverted clock input signal. A master selector is configured to provide a communication path from the master latch to the slave latch, and a slave selector is configured to provide a feedback path from the slave latch to the master latch. The foregoing I and Q signals are output directly from the respective master and slave latches without any intervening electronic circuitry.

Figure 1:
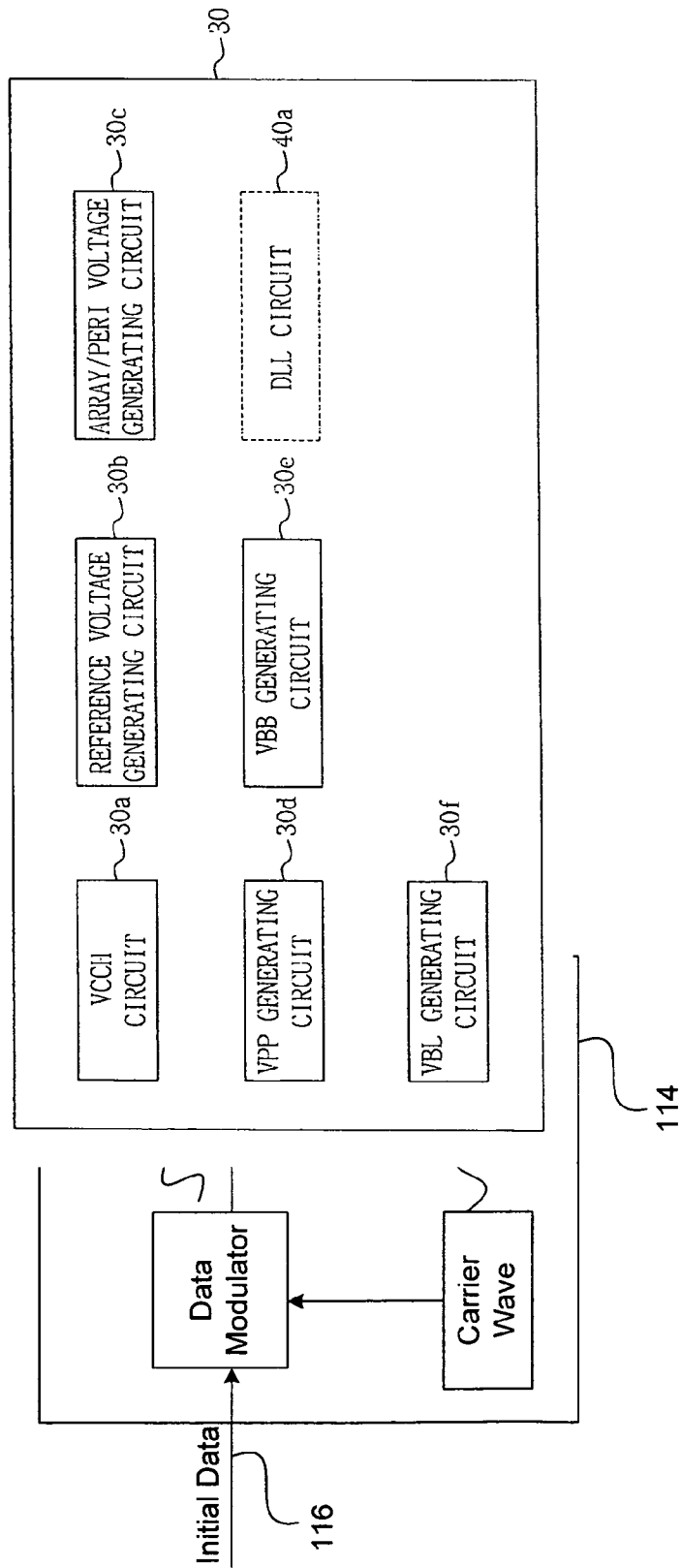
FIG. 1 is a block diagram of a data transmission system, in accordance with one embodiment of the present invention.

Referring now to FIG. 1, a block diagram of a data transmission system 110 is shown, in accordance with one embodiment of the present invention. In the FIG. 1 embodiment, data transmission system 110 includes, but is not limited to, a transmitter 114 and a receiver 122. In alternate embodiments, data transmission system 110 may be implemented using components and configurations in addition to, or instead of, certain of those components and configurations discussed in conjunction with the FIG. 1 embodiment.

In the FIG. 1 embodiment of data transmission system 110, a transmitter 114 utilizes a data modulator 126 to receive initial data 116 from any appropriate data source. Data modulator 126 then modulates the initial data 116 using a carrier wave 130. A driver 134 then outputs the modulated initial data 116 over any appropriate type of transmission channel as transmit data 118. A receiver 122 of data transmission system 110 may then receive and process the transmit data 118 to thereby provide final data 138 to any appropriate data destination. Further details regarding the implementation and utilization of receiver 122 are further discussed below in conjunction with FIGS. 2-13.

Figure 2:
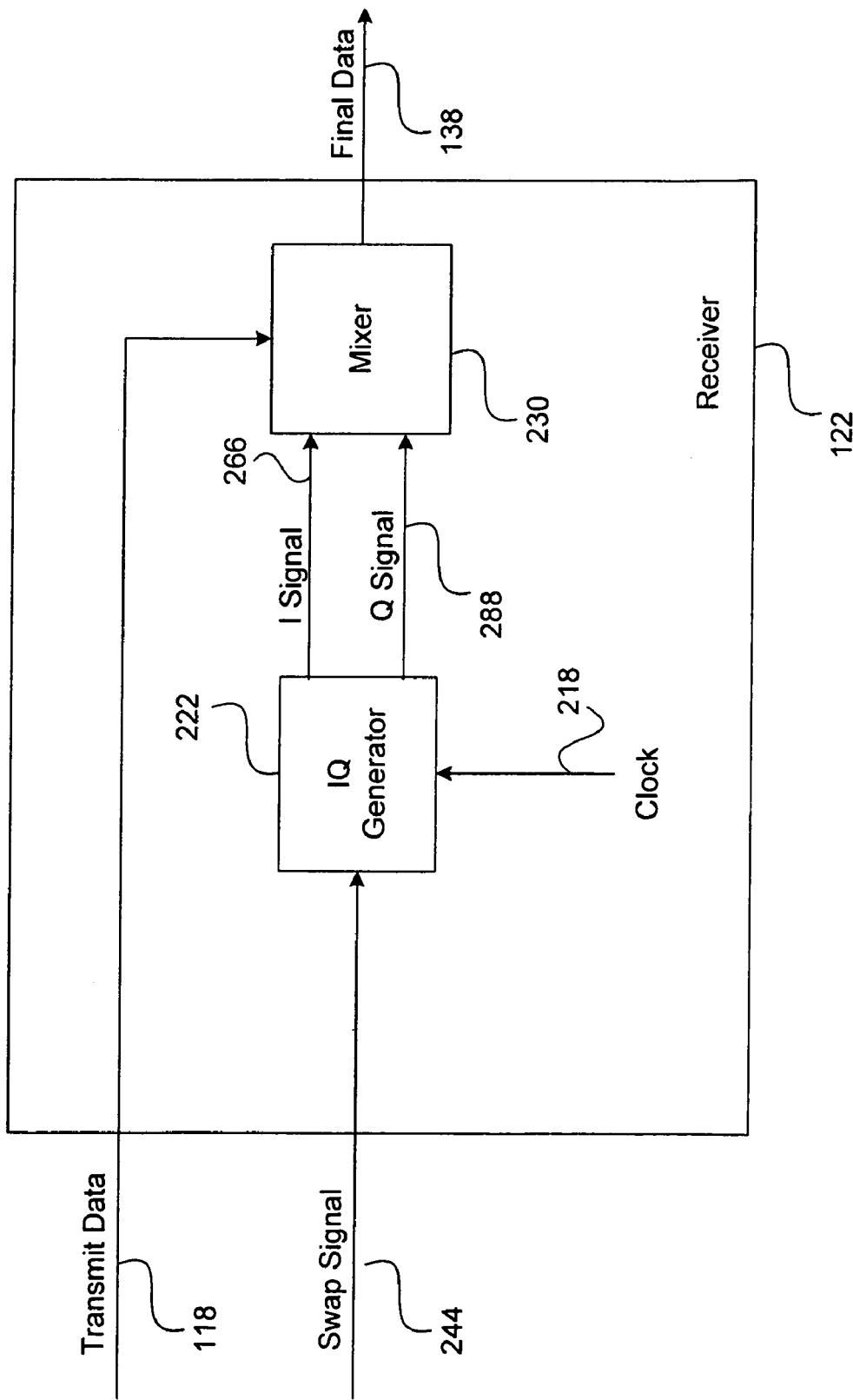
FIG. 2 is a block diagram for one embodiment of the receiver of FIG. 1, in accordance with the present invention.

Referring now to FIG. 2, a block diagram for one embodiment of the FIG. 1 receiver 122 is shown, in accordance with the present invention. In the FIG. 2 embodiment, receiver 122 may include, but is not limited to, an IQ generator 222 and a mixer 230. In alternate embodiments, receiver 122 may be implemented using components and configurations in addition to, or instead of, certain of those components and configurations discussed in conjunction with the FIG. 2 embodiment. In various embodiments, receiver 122 may be implemented as any other appropriate type of electronic device, such as a television tuner or a cellular telephone.

IQ generators are used extensively in many applications to generate quadrature signal that include in-phase (I) signals and quadrature (Q) signals, from a single clock source. For example, in a typical communications system using Single Side Band Modulation (SSB) two versions of the original signal (90 degrees out-of-phase with respect to each other) are mixed with carrier waves that are also 90 degrees out-of-phase with respect to each other. By adding or subtracting the mixed products, an upper sideband or lower sideband modulated signal results. The accuracy of the 90-degree phase shift is important to the efficiency of the mixer 230 and to the minimization of unwanted spurs in the output signal. The ability to swap I and Q signals allows the receiver 122 to be flexibly configured for either upper or lower sideband modulation schemes.

In the FIG. 2 embodiment, transmit data 118 may be received from any desired data source, and may be encoded in any appropriate data format. For example, in certain embodiments, transmit data 118 may be received from a transmitter 114 of a data transmission system 110 (FIG. 1). In the FIG. 2 embodiment, IQ generator 222 receives a clock signal 218 and responsively generates quadrature signals that include an I signal 266 and a Q signal 288 that are provided to mixer 230. These quadrature signals (I and Q) are preferably implemented with the same or similar waveform (typically derived from clock 218 at one half the clock frequency). However, the quadrature signals are nominally ninety degrees out of phase with respect to each other. Mixer 230 then utilizes the quadrature signals to demodulate transmit data 118 for producing final data 138. In certain embodiments, receiver 122 may be implemented as a single-sideband receiver that utilizes only one sideband (upper or lower) at a given time.

In accordance with the present invention, a swap signal may be provided in any appropriate manner (for example from an external processor) to perform a swap function that inverts the relative phase relationship of I signal 266 and Q signal 288. Depending upon whether I signal 266 leads or lags Q signal 288, receiver 122 operates in either an upper sideband mode or a lower sideband mode. Furthermore, any IQ phase mismatch in which the phase difference is not precisely ninety degrees typically results in unwanted generation of the non-selected sideband. Additional details for the implementation and utilization of IQ generators are further discussed below in conjunction with FIGS. 3-13.

Figure 3:
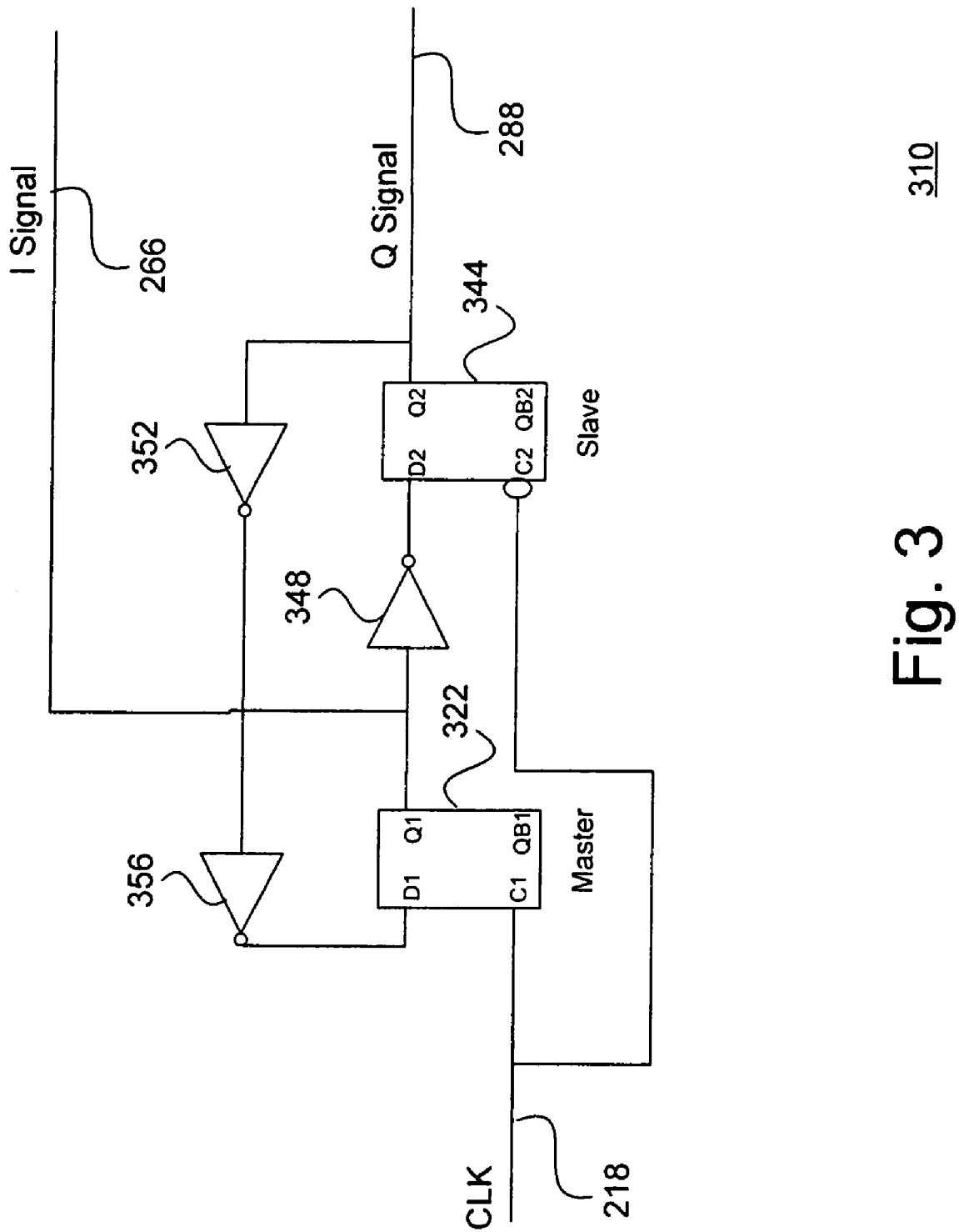
FIG. 3 is a schematic diagram for one embodiment of an IQ generator.

Referring now to FIG. 3, a schematic diagram for one embodiment of a basic IQ generator 310 is shown. The FIG. 3 diagram is presented for purposes of illustration, and in alternate embodiments, IQ generators may be implemented with components and functionalities in addition to, or instead of, certain of those components and functionalities discussed in conjunction with the FIG. 3 embodiment.

The FIG. 3 embodiment shows an IQ generator 310 comprising a clock source (CLK) 218 and a master slave flip flop (FF). In the FIG. 3 embodiment, master slave FF includes a master latch 322 and a slave latch 344 that may be implemented in any effective manner. For example, in certain embodiments, master latch 322 and slave latch 344 are each implemented as a level-triggered D-latch that operate in combination to create an edge-triggered master slave FF. The master and slave latches each have a latch input D, a clock input C, a non-inverted latch output Q, and an inverted latch output QB. Data on a latch input D is passed to a latch output Q on a positive level of latch clock input C, and is inverted at latch output QB.

In the FIG. 3 embodiment, master latch 322 and slave latch 344 are latched on the opposite phases of the clock 218 because of the inverter on the slave latch clock input C2. Normally, the slave output QB2 is fed back to the master input D1 to create a divide-by-2 function. In the FIG. 3 embodiment, inverter 348 has been added to master output Q1, and inverters 352 and 356 have been added to slave output Q2 in order to match master/slave Q and QB loading. The divideby-2 function is still achieved by having an overall inversion from master output Q to master input D. Additional details for the implementation and utilization of IQ generator 310 are further discussed below in conjunction with FIG. 4.

Figure 4:
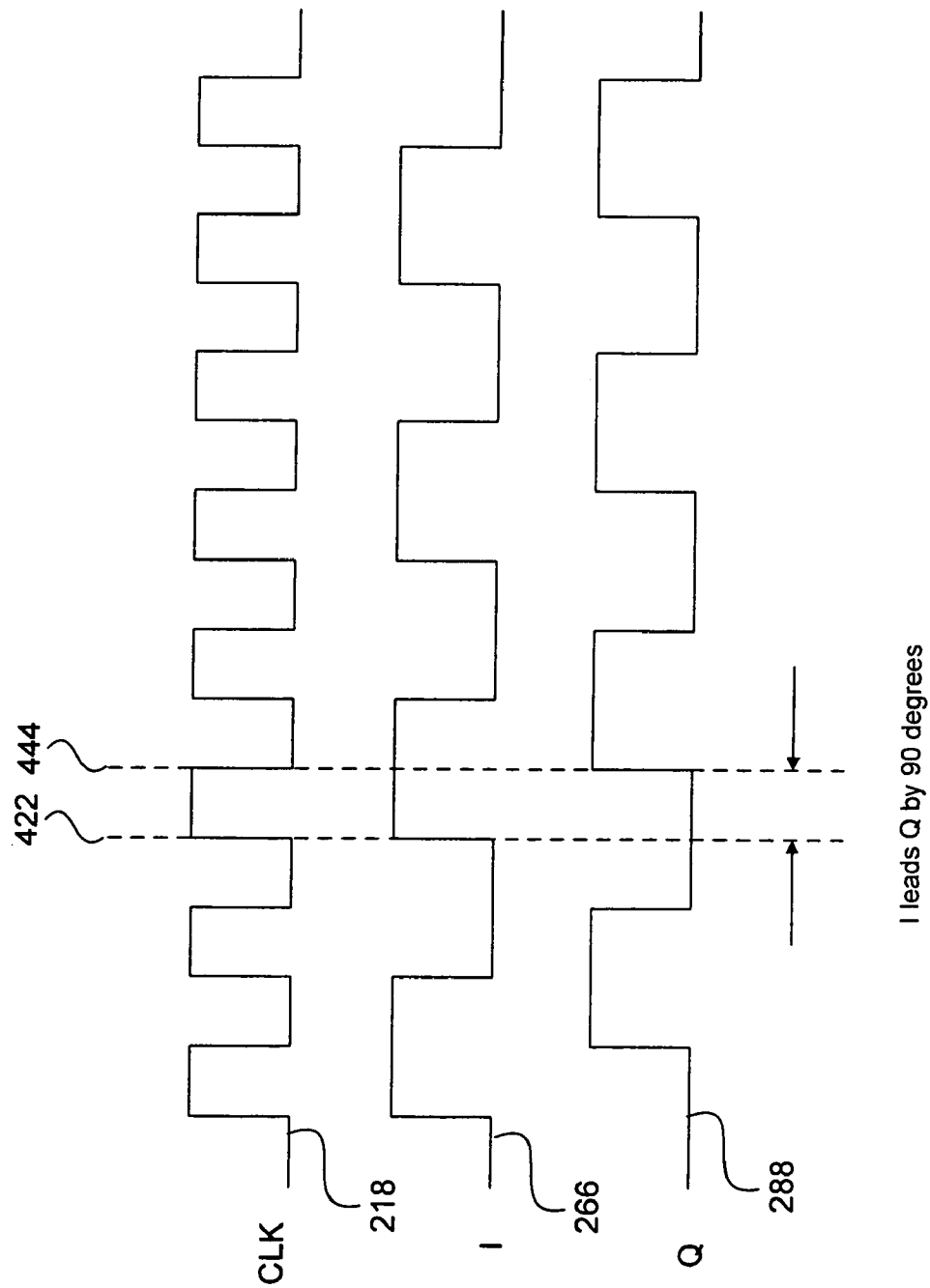
FIG. 4 is an exemplary timing diagram illustrating certain functions of the IQ generator of FIG. 3.

Referring now to FIG. 4, an exemplary timing diagram illustrating certain functions of the FIG. 3 IQ generator 310 is shown. The FIG. 4 diagram is presented for purposes of illustration. In alternate embodiments, IQ generators may readily utilize waveforms, timing relationships, and functionalities, in addition to, or instead of, certain of those waveforms, timing relationships, and functionalities discussed in conjunction with the FIG. 4 embodiment.

In the FIG. 4 embodiment, I signal 266 and Q signal 288 are running at half the frequency of clock signal (CLK) 218 and are separated by a 90-degree phase shift. It should be noted that the phase separation of I and Q for this type of IQ generator 310 is directly related to the input clock duty cycle and component mismatches between the master latch 322 and slave latch 344. For the purposes of describing this invention, the input clock 218 is assumed to have a fixed 50:50 duty cycle.

IQ generator 310 of FIG. 3 will typically produce IQ signals where I signal 266 leads Q signal 288 by 90 degrees. However, if I and Q are inverted, Q would lead I by 90 degrees. It is important to have balanced I and Q signal paths, so simply inverting one of the quadrature signals is not an optimal solution in terms of IQ matching. One possible alternative is further discussed below in conjunction with the FIG. 5 embodiment.

Figure 5:
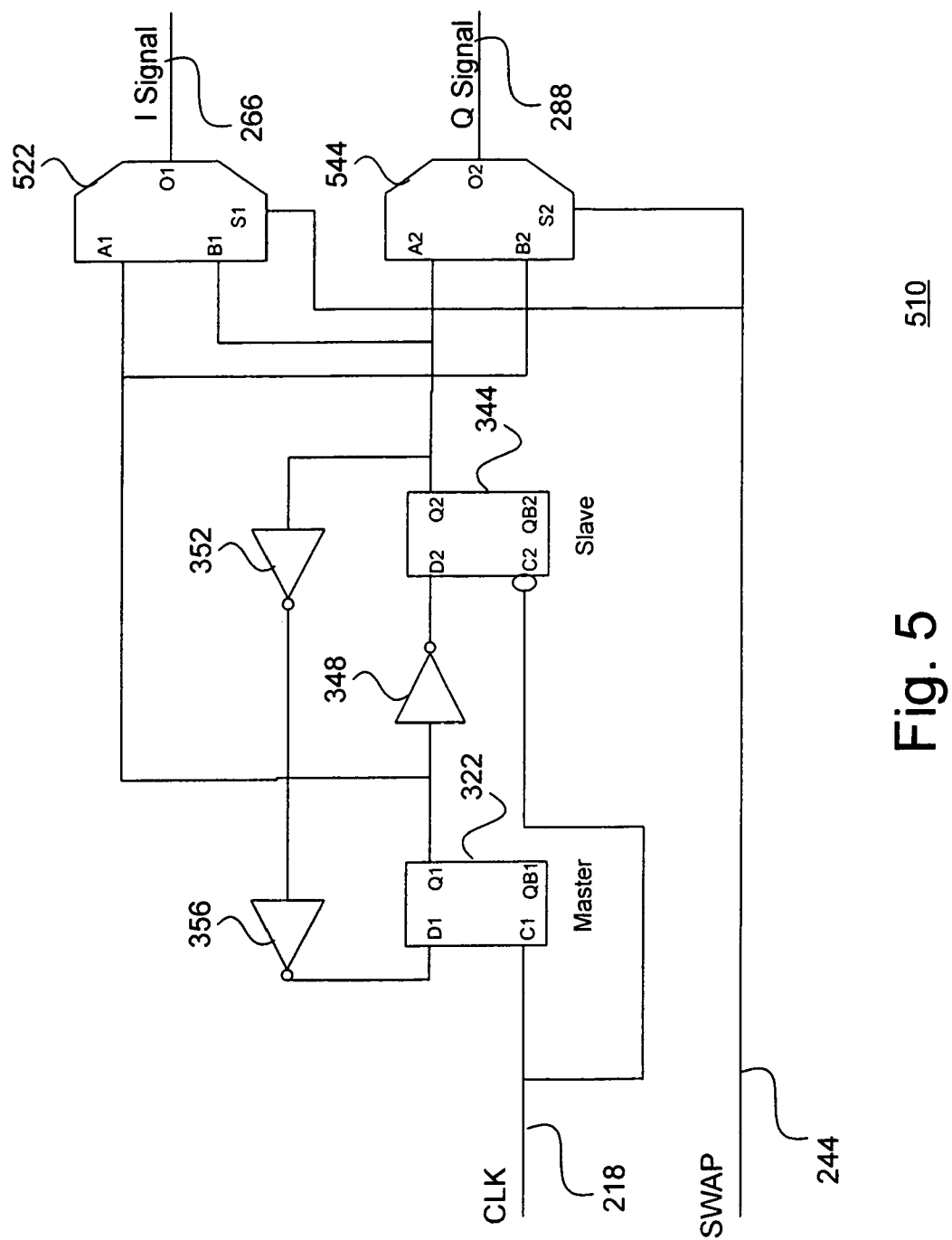
FIG. 5 is a schematic diagram for one embodiment of an IQ generator with a swap function.

Referring now to FIG. 5, a schematic diagram for one embodiment of an IQ generator 510 with a swap function is shown. In certain embodiments, the FIG. 5 IQ generator 510 may correspond to IQ generator 222 shown in FIG. 2. The FIG. 5 diagram is presented for purposes of illustration, and in alternate embodiments, IQ generators may be implemented with components and functionalities in addition to, or instead of, certain of those components and functionalities discussed in conjunction with the FIG. 5 embodiment.

Certain elements of the FIG. 5 embodiment have basic operational functionalities that are the same or similar to those of identically-numbered elements from the FIG. 3 embodiment (for example, master latch 322 and slave latch 344). In addition, the FIG. 5 embodiment includes two selectors 522 and 544 which each functions as a multiplexer to provide a selector output O that is selected from either a selector input A or a selector input B depending upon whether a selector swap input S, is activated or deactivated.

In the FIG. 5 embodiment, the master output Q1 has the same load and route to the I signal output 266 as the slave output Q2 has to the Q signal output 288. When the swap signal (SWAP) 244 is enabled, master output Q1 is then routed to Q signal output 288 and slave output Q1 is routed to I signal output 266. Again the signal paths are identical. This solution is satisfactory except that the IQ mismatch is now dependant on the duty-cycle error of CLK 218, component matching errors of master latch 322 and slave latch 344, and component matching errors between selector 522 and selector 544. The addition of two master-slave flip flops to re-time the two selector outputs, I and Q is one possible solution. However, the additional flip flops would consume additional power which may be significant since they are clocked at the input clock frequency which is twice the frequency of the IQ signal frequency.

Figure 6:
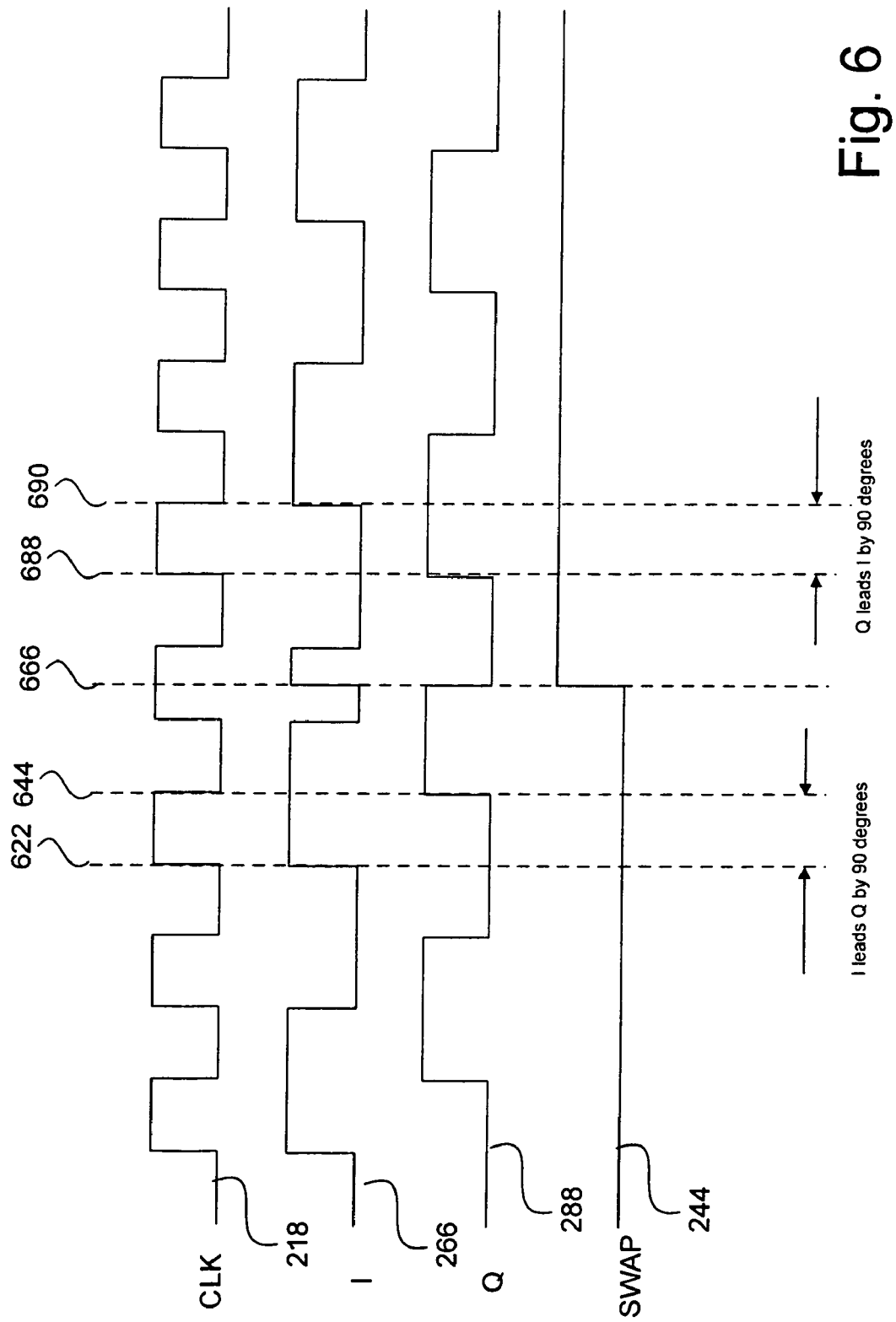
FIG. 6 is an exemplary timing diagram illustrating certain functions of the IQ generator of FIG. 5.

Referring now to FIG. 6, an exemplary timing diagram illustrating certain functions of the FIG. 5 IQ generator 510 is shown, in accordance with one embodiment of the present invention. The FIG. 6 diagram is presented for purposes of illustration. In alternate embodiments, the present invention may readily utilize waveforms, timing relationships, and functionalities, in addition to, or instead of, certain of those waveforms, timing relationships, and functionalities discussed in conjunction with the FIG. 6 embodiment.

In the FIG. 6 embodiment, I signal 266 and Q signal 288 are running at half the frequency of clock signal (CLK) 218 and are separated by a 90-degree phase shift. In the FIG. 6 embodiment, swap signal 244 is initially disabled, and I signal 266 is shown leading Q signal 288 at respective leading edges 622 and 644. At time 666, swap signal 244 is activated and an IQ swap function is triggered in which Q signal 288 leads I signal 266, as shown at respective leading edges 688 and 690.

Figure 7:
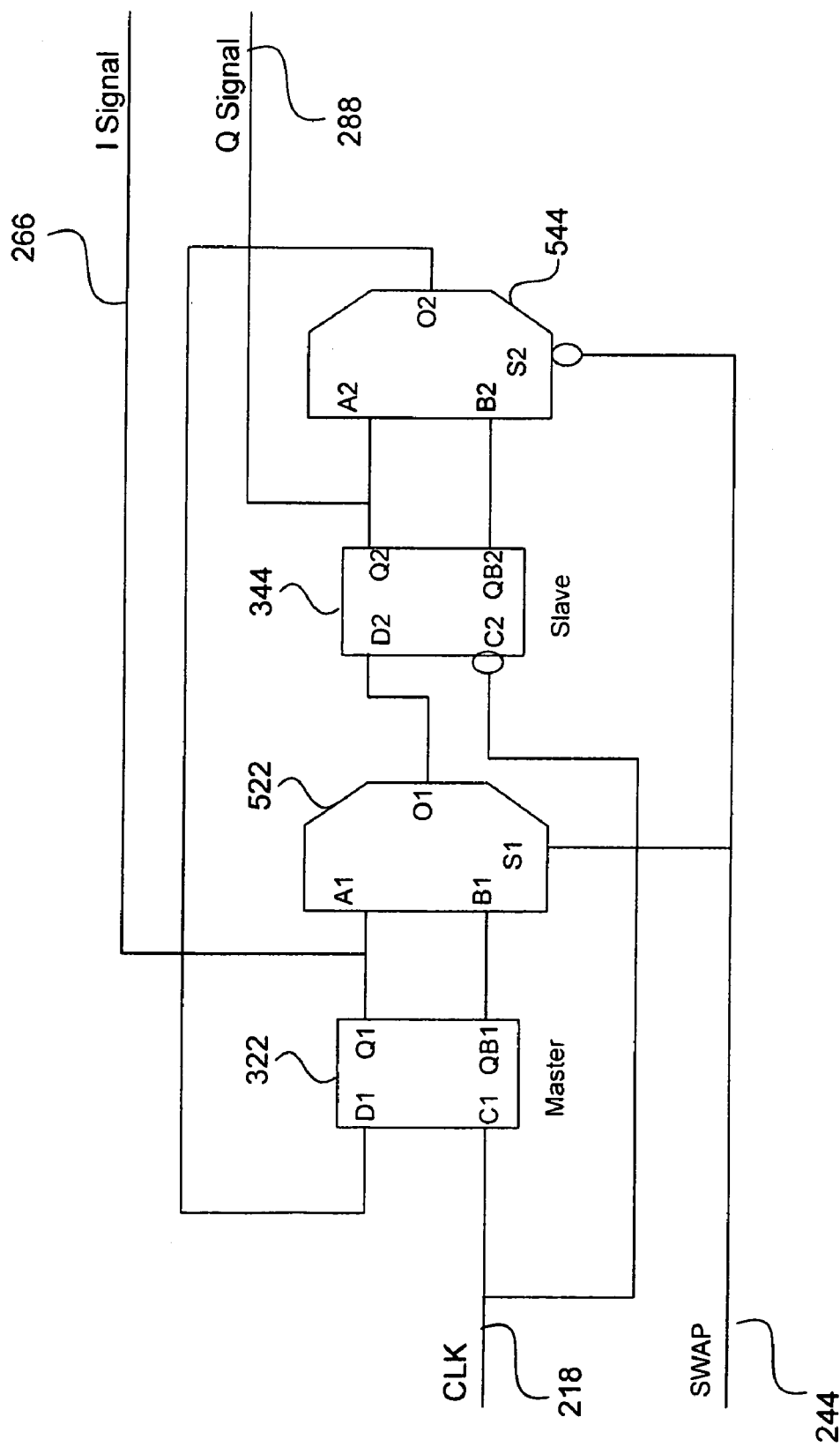
FIG. 7 is a schematic diagram for a first embodiment of an IQ generator with a swap function, in accordance with the present invention.

Referring now to FIG. 7, a schematic diagram for a first embodiment of an IQ generator 710 with a swap function is shown, according to the present invention. In certain embodiments, the FIG. 7 IQ generator 710 may correspond to IQ generator 222 shown in FIG. 2. Furthermore, certain elements of the FIG. 7 embodiment may have basic operational functionalities that are the same or similar to those of identically-numbered elements from the FIG. 5 embodiment (for example, master latch 322, slave latch 344, selector 522, and selector 544). The FIG. 7 diagram is presented for purposes of illustration, and in alternate embodiments, the present invention may be implemented with components and functionalities in addition to, or instead of, certain of those components and functionalities discussed in conjunction with the FIG. 7 embodiment.

In the FIG. 7 embodiment, a master latch 322 receives a clock signal (CLK) 218 at a master clock input C1, and a slave latch 344 receives an inverted clock signal 218 at a slave clock input C2. A master output Q1 of master latch 322 is directly provided to mixer 320 (FIG. 2) as I signal 266 without any intervening electronic circuitry. The master output Q1 of master latch 322 is also provided to a master selector input A1 of master selector 522, and an inverted master output QB1 of master latch 322 is provided to a master selector input B1 of master selector 522. A master latch output O1 is provided to a slave input D2 of slave latch 344.

In the FIG. 7 embodiment, a slave output Q2 of slave latch 344 is directly provided to mixer 320 (FIG. 2) as Q signal 288 without any intervening electronic circuitry. The slave output Q2 of slave latch 344 is also provided to a slave selector input A2 of slave selector 544, and an inverted slave output QB2 of slave latch 344 is provided to a slave selector input B2 of slave selector 544. A slave latch output O2 is provided via a feedback loop to a master input D1 of master latch 322.

In the FIG. 7 embodiment, master selector 522 receives a swap signal (SWAP) 244 at a master selector swap input S1, and slave selector 544 receives an inverted swap signal (SWAP) 244 at a slave selector swap input S2. Selectors 522 and 544 function as multiplexers to provide corresponding selector outputs O that are selected from either a selector input A or a selector input B depending upon whether selector swap signal S 244 is activated or deactivated. However, since swap signal 244 is inverted for slave selector 544, slave selector 544 selects the opposite (inverted) selector input with respect to the master selector 522.

In the FIG. 7 embodiment, when swap signal 244 is disabled, I signal 266 leads Q signal 288 by ninety degrees. Master output Q1 is provided to slave input D2, and slave output QB2 is looped back to master input D1. Conversely, when swap signal is enabled, I signal 266 lags Q signal 288 by ninety degrees. Master output QB1 is provided to slave input D2, and slave output Q2 is looped back to master input D1. Master selector 522 is therefore inserted in a cascaded configuration between master latch 322 and slave latch 344, and slave selector 544 is inserted in a feedback loop using a cascade configuration between slave latch 344 and master latch 322. In addition, master latch 322 provides I signal 266 directly to mixer 230 (FIG. 2) without master selector 522 or any other circuitry intervening. Similarly, slave latch 344 provides Q signal 288 directly to mixer 230 (FIG. 2) without slave selector 544 or any other circuitry intervening.

In the FIG. 7 embodiment, a divide-by 2-function is achieved by utilizing a master-slave architecture with master output Q1 of master latch 322 inverted, latched through slave latch 344, and fed back to the master input D1 of master latch 322. However, additional circuitry (selectors 522 and 544) driving the master input D1 and slave input D2 will either invert or not invert the D inputs depending on the polarity of swap signal (SWAP) 244. With SWAP HIGH or LOW, the inversion required for a divide-by 2-function is maintained. I signal 266 and Q signal 288 are taken directly from the master output Q1 and slave output Q2, respectively. I and Q waveform timing is dictated by the input CLK signal 218, and the relative phase of I signal 266 and Q signal 288 is controlled via the SWAP signal 244. The present invention thus overcomes sensitivity to component and layout mismatches of additional circuitry and any additional power used by subsequent re-timing by incorporating the IQ swap function within the master-slave flip flop itself.

Figure 8:
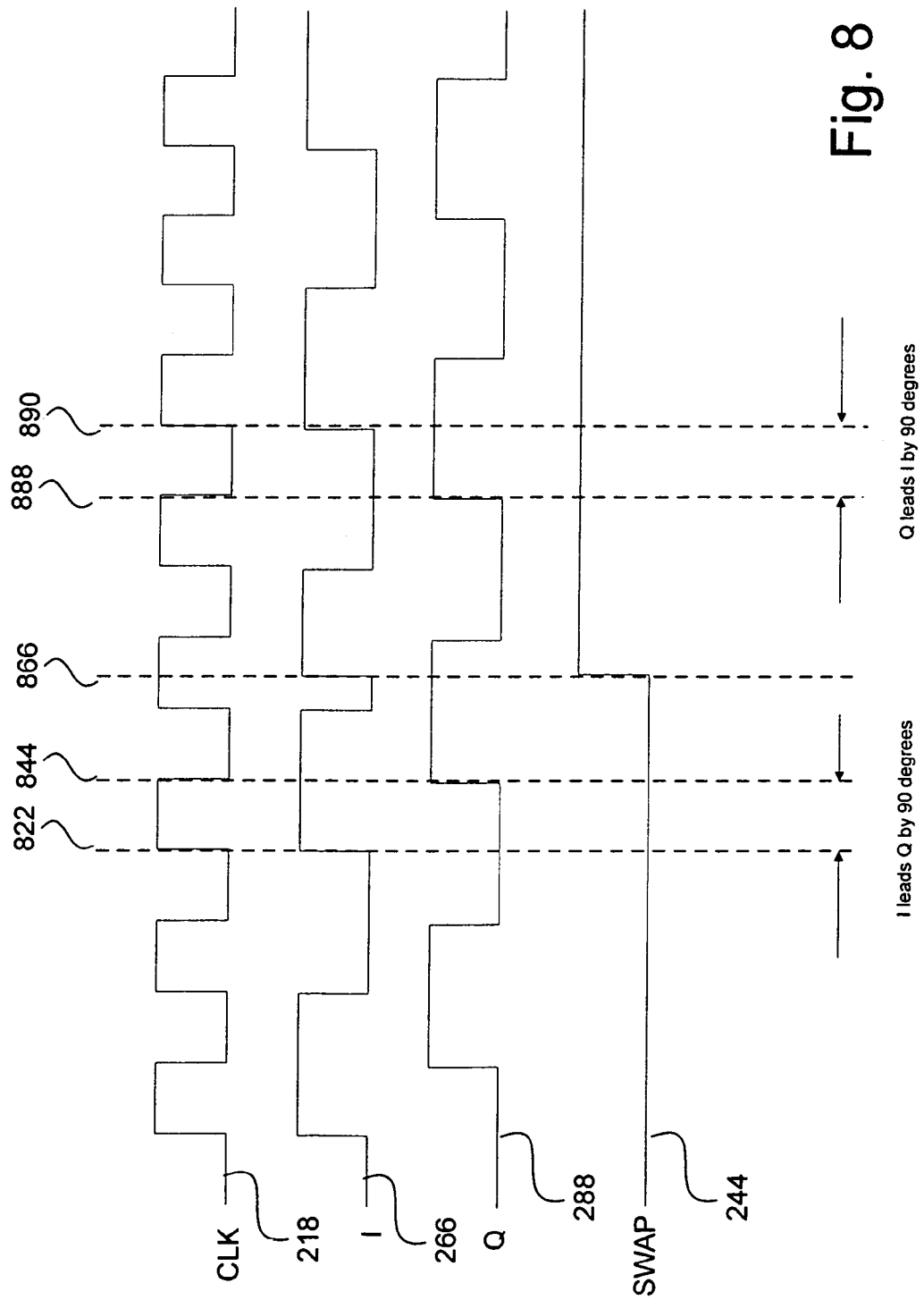
FIG. 8 is an exemplary timing diagram illustrating certain functions of the IQ generator of FIG. 7.

Referring now to FIG. 8, an exemplary timing diagram illustrating certain functions of the FIG. 7 IQ generator 710 is shown, in accordance with one embodiment of the present invention. The FIG. 7 diagram is presented for purposes of illustration. In alternate embodiments, the present invention may readily utilize waveforms, timing relationships, and functionalities, in addition to, or instead of, certain of those waveforms, timing relationships, and functionalities discussed in conjunction with the FIG. 7 embodiment.

In the FIG. 8 embodiment, I signal 266 and Q signal 288 are running at half the frequency of clock signal (CLK) 218 and are separated by a 90-degree phase shift. In the FIG. 8 embodiment, swap signal 244 is initially disabled, and I signal 266 is shown leading Q signal 288 at respective leading edges 822 and 844. At time 866, swap signal 244 is activated and an IQ swap function is triggered in which Q signal 288 leads I signal 266, as shown at respective leading edges 888 and 890.

Figure 9:
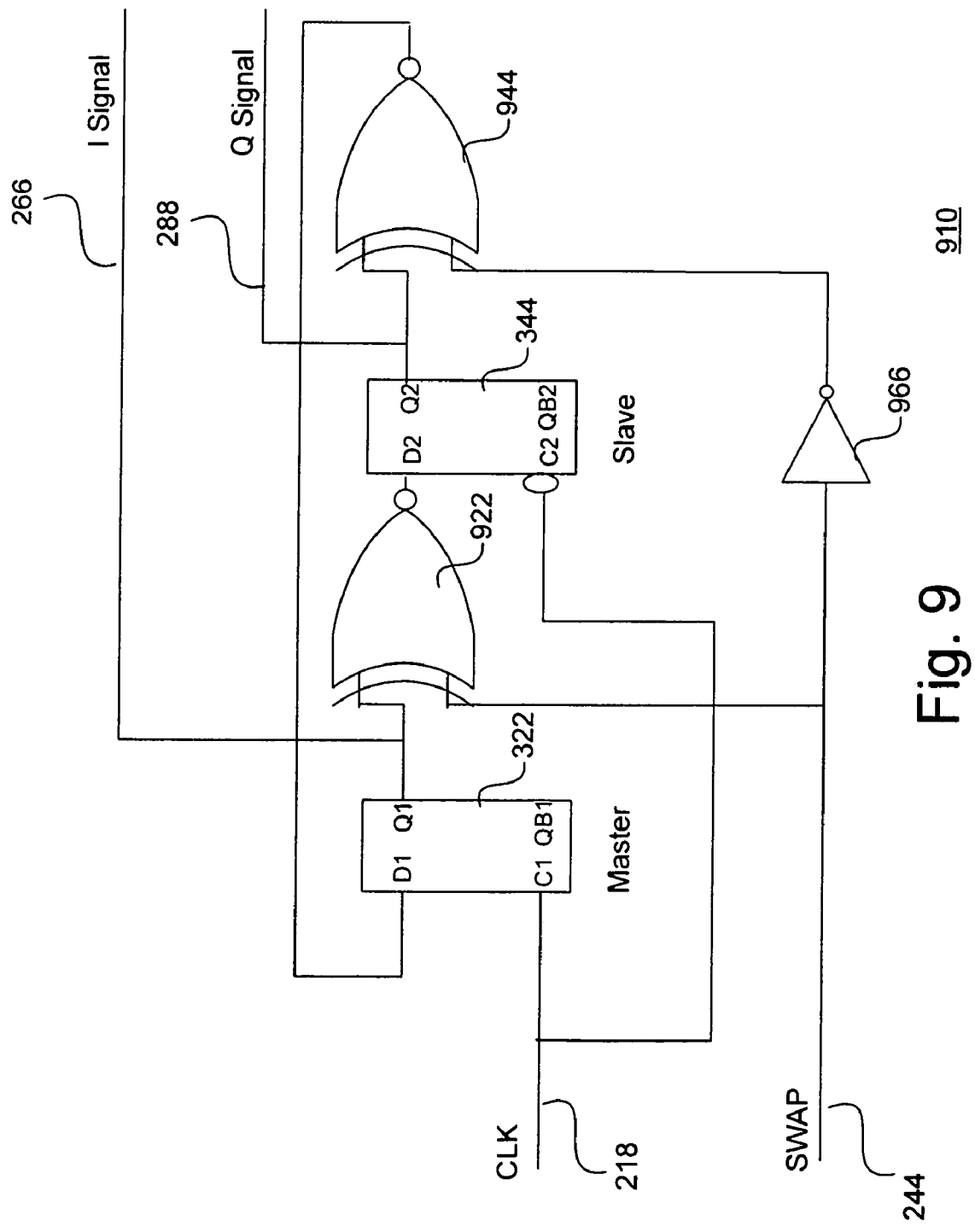
FIG. 9 is a schematic diagram for a second embodiment of an IQ generator with a swap function, in accordance with the present invention.

Referring now to FIG. 9, a schematic diagram for a second embodiment of an IQ generator 910 with a swap function is shown. In certain embodiments, the FIG. 9 IQ generator 910 may correspond to IQ generator 222 shown in FIG. 2. The FIG. 9 diagram is presented for purposes of illustration, and in alternate embodiments, the present invention may be implemented with components and functionalities in addition to, or instead of, certain of those components and functionalities discussed in conjunction with the FIG. 9 embodiment.

The FIG. 9 embodiment is similar to the foregoing FIG. 7 embodiment except that master selector 522 is replaced by a master exclusive nor gate 922 and slave selector 544 is replaced by a slave exclusive nor gate 944. In addition, the master output QB1 and the slave output QB2 are not connected. Instead, the master output Q1 and the slave output Q2 are connected to first inputs of the master exclusive nor gate 922 and slave exclusive nor gate 944, respectively. The second input of master exclusive nor gate 922 receives the swap signal 244, and the second input of slave exclusive nor gate 944 receives an inverted version of swap signal 244. In certain embodiments, the timing characteristics of the IQ generator 910 may be the same or similar to those timing characteristics portrayed in above in the FIG. 8 timing diagram.

Figure 10:
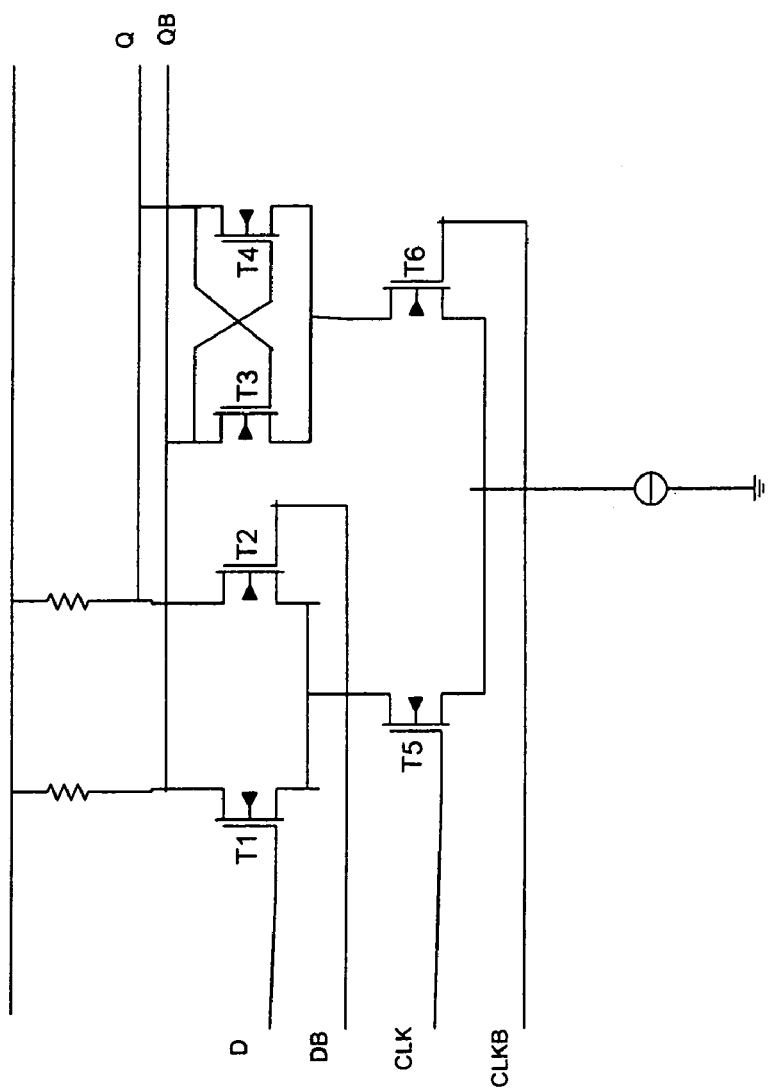
FIG. 10 is a schematic diagram for one embodiment of a differential latch.

Referring now to FIG. 10, a schematic diagram for one embodiment of a differential latch 1010 is shown. The FIG. 10 diagram is presented for purposes of illustration, and in alternate embodiments, differential latches may be implemented with components and functionalities in addition to, or instead of, certain of those components and functionalities discussed in conjunction with the FIG. 10 embodiment.

In the FIG. 10 embodiment, a basic differential latch 1010 is implemented utilizing current mode logic (CML) techniques. In the FIG. 10 embodiment, differential latch 1010 utilizes complementary transistor pairs to receive complementary input signal pairs for generating a latch output Q and an inverted latch output QB. The latch output Q is analogous to master output Q1 or slave output Q2 of the FIG. 7 embodiment. Similarly, latch output QB is analogous to slave output QB1 or slave output QB2 of the FIG. 7 embodiment. The complementary input signal pairs are implemented as pairs of inverted signals. Two differential latches 1010 may be cascaded to form an electrical circuit that is substantially equivalent to IQ generator 310 of FIG. 3.

In the FIG. 10 embodiment, differential latch 1010 includes a data transistor pair (transistors T1 and T2), a latch transistor pair (transistors T3 and T4), and a clock transistor pair (transistors T5 and T6). In the FIG. 10 embodiment, a CML divide-by-2 function may thus be achieved by cascading the two differential latches 1010 (a master latch followed by a slave latch which is clocked from the opposite phase of the clock signal (CLK)). In certain embodiments, the timing characteristics of an IQ generator created by cascading two differential latches 1010 may be the same or similar to those timing characteristics portrayed above in the FIG. 4 timing diagram.

Figure 11:
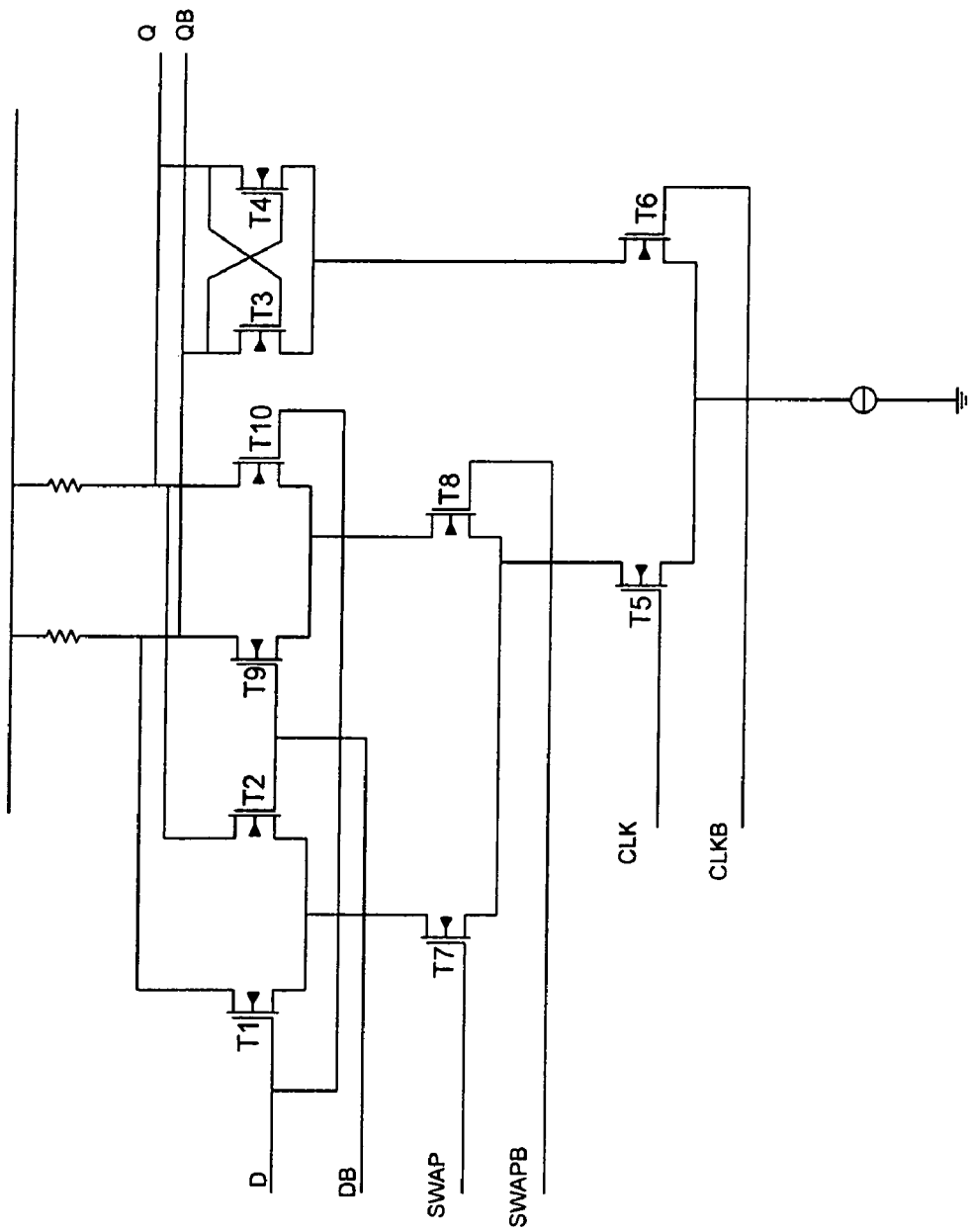
FIG. 11 is a schematic diagram for a first embodiment of a differential latch, in accordance with the present invention.

Referring now to FIG. 11, a schematic diagram for a first embodiment of a differential latch 1110 is shown in accordance with the present invention. The FIG. 11 diagram is presented for purposes of illustration, and in alternate embodiments, the present invention may be implemented with components and functionalities in addition to, or instead of, certain of those components and functionalities discussed in conjunction with the FIG. 11 embodiment.

In the FIG. 11 embodiment, a differential latch 1110 is implemented utilizing current mode logic (CML) techniques. In the FIG. 11 embodiment, differential latch 1110 utilizes complementary transistor pairs to receive complementary input signal pairs for generating a latch output Q and an inverted latch output QB. The latch output Q is analogous to master output Q1 or slave output Q2 of the FIG. 7 embodiment. Similarly, latch output QB is analogous to master output QB1 or slave output QB2 of the FIG. 7 embodiment. The complementary input signal pairs are implemented as pairs of inverted signals (D/DB, SWAP/SWAPB, and CLK/CLKB). Two differential latches 1110 may be cascaded to form an electrical circuit that is substantially equivalent to IQ generator 710 from FIG. 7.

In the FIG. 11 embodiment, differential latch 1110 includes a data transistor pair (transistors T1 and T2), a latch transistor pair (transistors T3 and T4), a clock transistor pair (transistors T5 and T6), a swap transistor pair (T7 and T8), and an inverted data transistor pair (T9 and T10). In the FIG. 11 embodiment, a CML divide-by-2 function may thus be achieved by cascading the two differential latches 1110 (a master latch followed by a slave latch which is clocked from the opposite phase of the clock signal (CLK)).

In the FIG. 11 embodiment, differential latch 1110 incorporates a swap function. In this case, two pairs of "D" input transistors (the data pair and the inverted data pair) are connected to the Q and QB latch outputs. One set of "D" inputs is inverted with respect to the other set. The selection of the "D" inputs is accomplished by the swap transistor pair which have been incorporated into the transistor "stack" between the upper "D" transistors and the lower "CLK" transistors. In certain embodiments, the timing characteristics of an IQ generator created by cascading two differential latches 1110 may be the same or similar to those characteristics portrayed in above in the FIG. 8 timing diagram.

Figure 12:
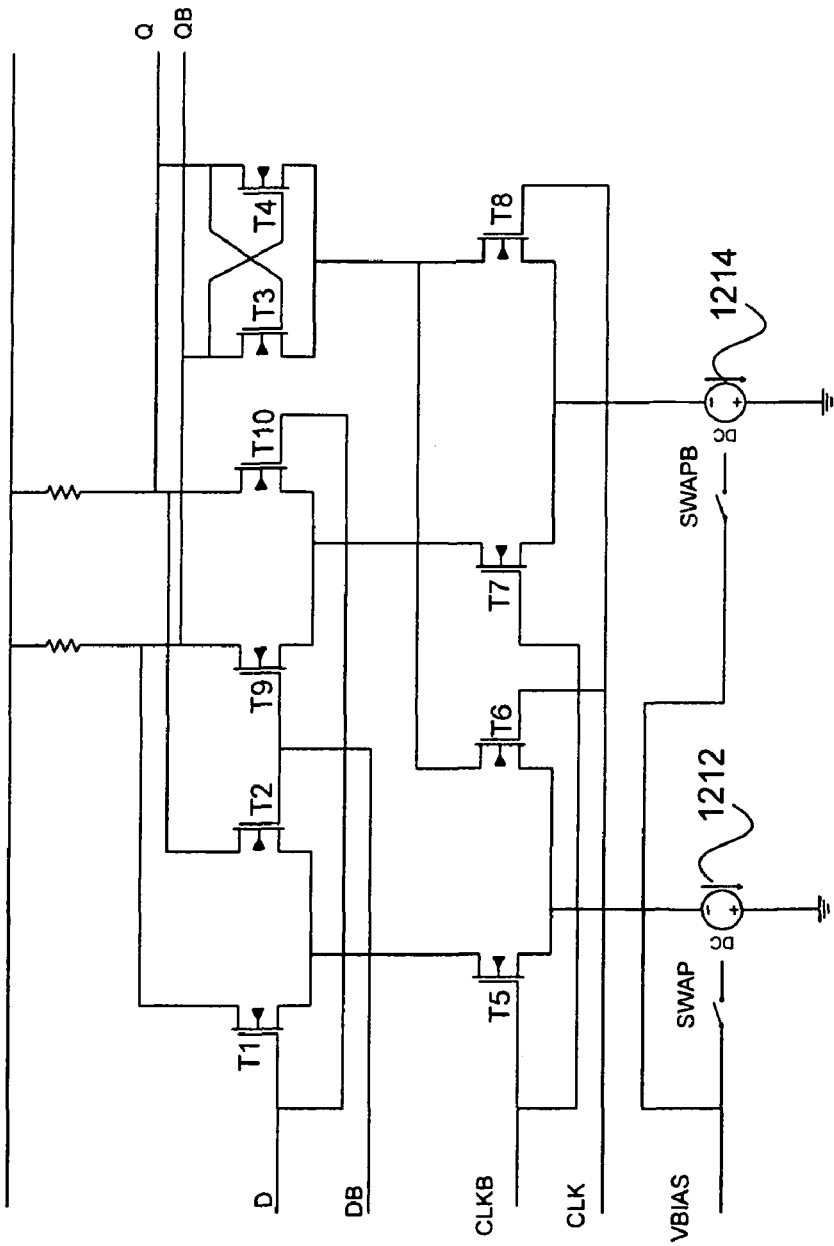
FIG. 12 is a schematic diagram for a second embodiment of a differential latch, in accordance with the present invention.

Referring now to FIG. 12, a schematic diagram for a second embodiment of a differential latch 1210 is shown in accordance with the present invention. The FIG. 12 diagram is presented for purposes of illustration, and in alternate embodiments, the present invention may be implemented with components and functionalities in addition to, or instead of, certain of those components and functionalities discussed in conjunction with the FIG. 12 embodiment.

In the FIG. 12 embodiment, a differential latch 1210 is implemented utilizing current mode logic (CML) techniques. In the FIG. 12 embodiment, differential latch 1210 utilizes complementary transistor pairs to receive complementary input signal pairs for generating a latch output Q and an inverted latch output QB. The latch output Q is analogous to master output Q1 or slave output Q2 of the FIG. 7 embodiment. Similarly, latch output QB is analogous to master output QB1 or slave output QB2 of the FIG. 7 embodiment. The complementary input signal pairs are implemented as pairs of inverted signals (D/DB and CLK/CLKB). In addition, differential latch 1210 includes a VBIAS signal for controlling a swap function. Two differential latches 1210 may be cascaded to form an electrical circuit that is substantially equivalent to IQ generator 710 from FIG. 7.

In the FIG. 12 embodiment, differential latch 1210 includes a data transistor pair (transistors T1 and T2), a latch transistor pair (transistors T3 and T4), a clock transistor pair (transistors T5 and T6), an second clock transistor pair (T7 and T8), and an inverted data transistor pair (T9 and T10). In the FIG. 12 embodiment, the VBIAS signal selectively activates either a swap current source 1212 or a inverted swap current source 1214 to either enable or disable a swap function mode. In the FIG. 12 embodiment, a CML divide-by-2 function may thus be achieved by cascading the two differential latches 1210 (a master latch followed by a slave latch which is clocked from the opposite phase of the clock signal (CLK)).

In the FIG. 12 embodiment, differential latch 1210 therefore advantageously incorporates a swap function. In this case, two pairs of "D" input transistors are connected to the Q and QB outputs. One pair of "D" inputs is inverted with respect to the other pair. The selection of the "D" inputs is accomplished by the swap switches that enable either current source "SWAP" 1212 or current source "SWAPB" 1214. In certain embodiments, the timing characteristics of an IQ generator created by cascading two differential latches 1210 may be the same or similar to those characteristics portrayed in above in the FIG. 8 timing diagram.

Figure 13:
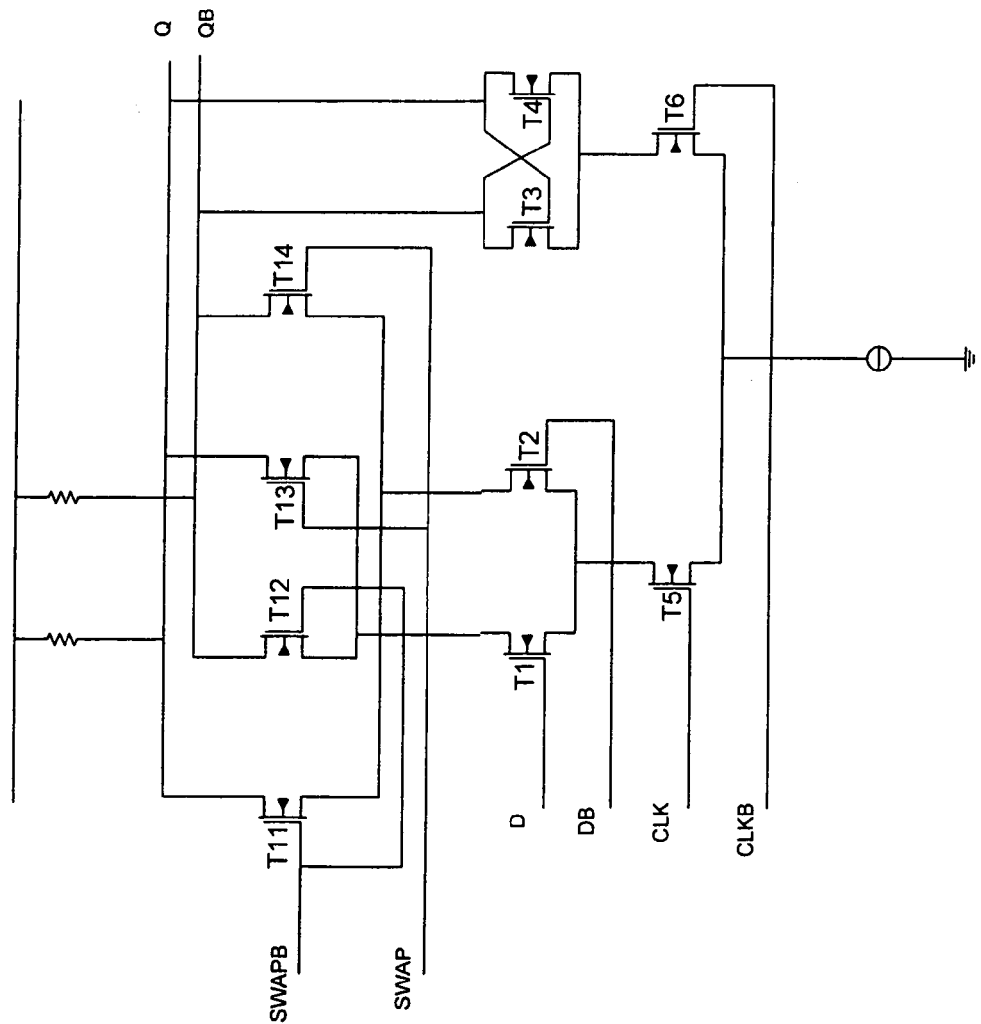
FIG. 13 is a schematic diagram for a third embodiment of a differential latch, in accordance with the present invention.

Referring now to FIG. 13, a schematic diagram for a third embodiment of a differential latch 1310 is shown in accordance with the present invention. The FIG. 13 diagram is presented for purposes of illustration, and in alternate embodiments, the present invention may be implemented with components and functionalities in addition to, or instead of, certain of those components and functionalities discussed in conjunction with the FIG. 13 embodiment.

In the FIG. 13 embodiment, a differential latch 1310 is implemented utilizing current mode logic (CML) techniques. In the FIG. 13 embodiment, differential latch 1310 utilizes complementary transistor pairs to receive complementary input signal pairs for generating a latch output Q and an inverted latch output QB. The latch output Q is analogous to master output Q1 or slave output Q2 of the FIG. 7 embodiment. Similarly, latch output QB is analogous to master output QB1 or slave output QB2 of the FIG. 7 embodiment. The complementary input signal pairs are implemented as pairs of inverted signals (D/DB, CLK/CLKB, and SWAP/SWAPB). Two differential latches 1310 may be cascaded to form an electrical circuit that is substantially equivalent to IQ generator 710 from FIG. 7.

In the FIG. 13 embodiment, differential latch 1310 includes a single data transistor pair (transistors T1 and T2), a latch transistor pair (transistors T3 and T4), and a clock transistor pair (transistors T5 and T6). Differential latch 1310 also includes two pairs of cascode transistors that are selectively activated by the SWAP and SWAPB signals. For example, a SWAP signal may be activated to pass the D input through T13 to the Q output, and to also pass the DB input through transistor T14 to the QB output. Alternately, the SWAPB signal may be activated to pass the D input through T12 to the QB output, and to also pass the DB input through transistor T11 to the Q output.

In the FIG. 13 embodiment, a CML divide-by-2 function may thus be achieved by cascading the two differential latches 1310 (a master latch followed by a slave latch which is clocked from the opposite phase of the clock signal (CLK)).

In the FIG. 13 embodiment, differential latch 1310 therefore advantageously incorporates a swap function. In this case, the "D" transistors are connected to the Q and QB outputs via two pairs of cascode transistors. SWAP HIGH will present inverted data to Q and QB outputs, whereas SWAP LOW will present non-inverted data to the Q and QB outputs. In certain embodiments, the timing characteristics of an IQ generator created by cascading two differential latches 1310 may be the same or similar to those characteristics portrayed in above in the FIG. 8 timing diagram. In all of the foregoing CML latch embodiments of FIGS. 11, 12, and 13, no additional power is used to incorporate the swap function. Cascading two of these differential latches as a master/slave combination thus provides an improved divide-by-two IQ generator with a self re-timed swap function.

The invention has been explained above with reference to certain embodiments. Other embodiments will be apparent to those skilled in the art in light of this disclosure. For example, the present invention may readily be implemented using configurations and techniques other than those described in the embodiments above. Additionally, the present invention may effectively be used in conjunction with systems other than those described above. Therefore, these and other variations upon the discussed embodiments are intended to be covered by the present invention, which is limited only by the appended claims.

What is claimed is:

1. A system for implementing an IQ generator, comprising:
   a master latch that generates an I signal as an in-phase signal in response to a clock input signal;
   a slave latch that generates a Q signal as a quadrature signal in response to an inverted clock input signal;
   a master selector that is configured to provide a selectable communication path from said master latch to said slave latch; and
   a slave selector that is configured to provide a selectable feedback path from said slave latch to said master latch, said I signal being output directly from said master latch without intervening electronic circuitry, said Q signal being output directly from said slave latch without said intervening electronic circuitry.

2. The system of claim 1 wherein said master latch generates said I signal from a master latch output in response to said clock input signal.

3. The system of claim 2 wherein said slave latch generates said Q signal from a slave latch output in response to said inverted clock input signal.

4. The system of claim 3 wherein said master selector generates a master selector output from either said master latch output or an inverted master latch output in response to a swap signal, said master selector output being provided to a slave data input of said slave latch.

5. The system of claim 4 wherein said slave selector generates a slave selector output from either said slave latch output or an inverted slave latch output in response to an inverted swap signal, said slave selector output being provided to a master data input of said master latch.

6. The system of claim 1 wherein said IQ generator is configured as a divide-by-two device that generates said I signal and said Q signal at an output frequency that is one half of an input frequency of said clock input signal.

7. The system of claim 1 wherein said IQ generator outputs said I signal and said Q signal with a ninety-degree phase separation.

8. The system of claim 1 wherein said IQ generator provides said I signal and said Q signal as quadrature signals to a single-sideband radio-frequency receiver that includes a mixer device that utilizes said I signal and said Q signal to demodulate a transmitted input signal.

9. The system of claim 1 wherein said IQ generator utilizes a swap signal to enable or disable an IQ swap function, said I signal leading said Q signal by ninety-degrees when said IQ swap function is disabled, said Q signal leading said I signal by ninety-degrees when said IQ swap function is enabled.

10. The system of claim 9 wherein said IQ swap function enables a single-sideband radio-frequency receiver to select from either an upper-sideband mode or a lower-sideband mode depending upon a phase relationship of said I signal with respect to said Q signal.

11. The system of claim 1 wherein said master latch and said slave latch are implemented as D-latches, said master selector and said slave selector being implemented as multiplexer devices.

12. The system of claim 1 wherein said master selector and said slave selector are implemented as exclusive nor devices.

13. The system of claim 1 wherein said IQ generator is implemented with differential logic circuitry that utilizes complementary transistor pairs to receive complementary input signals.

14. The system of claim 13 wherein said complementary transistor pairs include a data pair, an inverted data pair, a latch pair, a swap pair, and a clock pair, said complementary input signals including complementary data, swap, and clock signals.

15. The system of claim 13 wherein said complementary transistor pairs include a data pair, an inverted data pair, a latch pair, a clock pair, and an inverted clock pair, said complementary input signals including complementary data and clock signals, said IQ generator utilizing a VBIAS input signal to control a swap current source and an inverted swap current source.

16. The system of claim 13 wherein said complementary transistor pairs include a data pair; a latch pair, and a clock pair, said complementary input signals including complementary data, clock, and swap signals, said IQ generator utilizing two cascode output transistor pairs to select latch output signals.

17. The system of claim 1 wherein said master latch receives said clock input signal at a master clock input, said slave latch receiving said inverted clock input signal at a slave clock input, a master output of said master latch being directly output as said I signal, said master output also being provided to a first master selector input of said master selector, an inverted master output of said master latch being provided to a second master selector input of said master selector, a master latch output being provided to a slave data input of said slave latch.

18. The system of claim 17 wherein a slave output of said slave latch is directly output as said Q signal, said slave output also being provided to a first slave selector input of said slave selector, an inverted slave output of said slave latch being provided to a second slave selector input of said slave selector, a slave latch output being provided via a feedback loop to a master data input of said master latch, said master selector receiving a swap signal at a master selector swap input, said slave selector receiving an inverted swap signal at a slave selector swap input.

19. A method for implementing an IQ generator, comprising:
generating an I signal with a master latch in response to a clock input signal, said I signal being an in-phase signal;
generating a Q signal with a slave latch in response to an inverted clock input signal, said Q signal being a quadrature signal;
configuring a master selector to provide a selectable communication path from said master latch to said slave latch;
configuring a slave selector to provide a selectable feedback path from said slave latch to said master latch;
outputting said I signal directly from said master latch without intervening electronic circuitry; and
outputting said Q signal directly from said slave latch without said intervening electronic circuitry.

20. A system for implementing an IQ generator, comprising:
a master latch that generates an I signal from a master latch output in response to a clock input signal, said I signal being an in-phase signal;
a slave latch that generates a Q signal from a slave latch output in response to an inverted clock input signal, said Q signal being a quadrature signal;
a master selector that generates a master selector output from either said master latch output or an inverted master latch output in response to a swap signal, said master selector output being provided to a slave data input of said slave latch; and
a slave selector that generates a slave selector output from either said slave latch output or an inverted slave latch output in response to an inverted swap signal, said slave selector output being provided to a master data input of said master latch, said I signal being output directly from said master latch output without intervening electronic circuitry, said Q signal being output directly from said slave latch output without said intervening electronic circuitry.

* * * * *